United States Patent [19]

Shimoto et al.

[11] Patent Number: 5,712,506
[45] Date of Patent: Jan. 27, 1998

[54] SEMICONDUCTOR DEVICE WITH PASSIVATION LAYER OF BENZOCYCLOBUTENE POLYMER AND SILICON POWDER

[75] Inventors: Tadanori Shimoto; Koji Matsui, both of Tokyo, Japan

[73] Assignee: NEC Corporation, Tokyo, Japan

[21] Appl. No.: 547,727

[22] Filed: Oct. 26, 1995

[30] Foreign Application Priority Data

Oct. 27, 1994 [JP] Japan .................. 6-286172

[51] Int. Cl.⁶ .................................. H01L 23/58
[52] U.S. Cl. .................. 257/633; 257/632; 257/646
[58] Field of Search .......................... 257/642, 633, 257/632, 646

[56] References Cited

U.S. PATENT DOCUMENTS

| 5,232,970 | 8/1993 | Solc et al. |
| 5,288,989 | 2/1994 | Ishaque et al. |
| 5,416,233 | 5/1995 | DeVries et al. |

FOREIGN PATENT DOCUMENTS

| 62-293726 | 12/1987 | Japan. |
| 230171 | 1/1990 | Japan. |

*Primary Examiner*—Stephen Meier
*Attorney, Agent, or Firm*—Whitham, Curtis, Whitham & McGinn

[57] ABSTRACT

In a semiconductor device having a passivation layer, the passivation layer is made of benzocyclobutene polymer and silicon power.

13 Claims, 4 Drawing Sheets

R···ALKYL GROUP

POLYMER

SEMICONDUCTOR DEVICE WITH PASSIVATION LAYER OF BENZOCYCLOBUTENE POLYMER AND SILICON POWDER

BACKGROUND OF THE INVENTION

1. Field of the Invention

The present invention relates to a semiconductor device and, more particularly, to an improved passivation layer thereof.

2. Description of the Related Art

In a semiconductor device, impurity diffusion regions are formed in a semiconductor substrate, and metal layers are formed thereon to connect the impurity diffusion regions to each other. A surface of the device is protected by a dielectric cover which is called a passivation layer. That is, the passivation layer protects the device against external mechanical stress and prevents the device from being contaminated by external moisture and ions.

A first prior art passivation layer is made of polyimide resin (see: JP-A-2-30171). This will be explained later in detail.

In the above-described first prior art passivation layer, however, as semiconductor devices have been fine-structured, the passivation layer cannot absorb roughness of a stepwise surface caused by multiple metal layers, so that flatness characteristics of the surface of the passivation layer cannot be obtained. Therefore, at a subsequent stage after the formation of the passivation layer, cracks and pinholes may be created in the passivation layer by thermal stress, mechanical stress and environmental stress applied to the rough stepwise surface, and the metal layers may be eroded by water and ions absorbed in the passivation layer due to its poor moistureproofness.

In order to improve the moistureproofness of the first prior art passivation layer, a second prior art passivation layer includes a double layer configuration formed by a polyimide resin layer and a silicon nitride layer thereon (see JP-A-62-293726). This will also be explained later in detail.

In the above-described second prior art passivation layer, however, although the silicon nitride layer has good moistureproofness, contact characteristics between the silicon nitride layer and the polyimide layer are deteriorated, so that water and ions are absorbed from the interface between the silicon nitride layer and the polyimide layer into the metal layers and the impurity diffusion regions of the device, thus reducing the reliability.

SUMMARY OF THE INVENTION

It is an object of the present invention to provide a passivation layer having good flatness characteristics and good moistureproofness characteristics.

According to the present invention, a passivation layer is made of benzocyclobutene polymer and silicon powder. The benzocyclobutene polymer per se is flexible, so that the benzocyclobutene polymer can absorb stress applied thereto. Also, the benzocyclobutene polymer has low water absorption properties, so as to exhibit good moistureproofness characteristics. Further, the addition of silicon powder to the benzocyclobutene polymer makes the thermal expansivity of the passivation layer substantially equal that of a semiconductor substrate such as a silicon substrate.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1 and 2.

Figure 1:
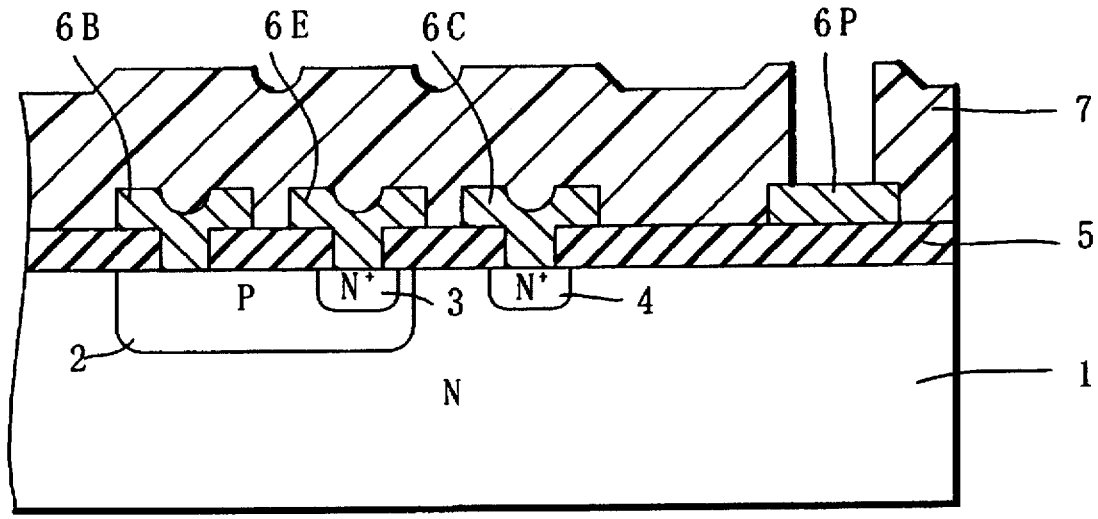
FIG. 1 is a cross-sectional view illustrating a first prior art semiconductor device.

In FIG. 1, which illustrates a first prior art semiconductor device (see JP-A-2-30171), reference numeral 1 designates an N-type monocrystalline silicon substrate serving as a collector region, 2 designates a P-type impurity diffusion region serving as a base region, 3 designates an $N^+$-type impurity diffusion region serving as an emitter region, and 4 designates an $N^+$-type impurity diffusion region serving as a collector take-out region. Formed on the silicon substrate 1 is a silicon oxide layer 5 having contact holes formed therein. Also, a base electrode 6B, an emitter electrode 6E and a collector electrode 6C are formed on the silicon oxide layer 5 and are connected to the base region 2, the emitter region 3 and the collector take-out region 4, respectively. Further, an input/output pad 6P is formed on the silicon oxide layer 5.

Also, provided on the entire surface is a polyimide resin layer 7 serving as a passivation layer.

In FIG. 1, when metal layers such as the electrodes 6B, 6E, 6C and 6P are more numerous and complex, the polyimide resin layer 7 cannot absorb a roughness of a stepwise surface of the metal layers. That is, polyimide resin is formed by dehydrating polycondensation of a polyimide precursor, and therefore, in the dehydrating polycondensation process, the passivation layer is reduced in volume. As a result, the flatness characteristics of the polyimide resin layer 7 are deteriorated. Therefore, at a subsequent stage of the polyimide resin layer 7, cracks and pinholes may be created in the polyimide resin layer 7 by thermal stress, mechanical stress and environmental stress applied to the rough stepwise surface thereof. Also, the electrodes 6B, 6E, 6C and the pad 6P may be eroded by water and ions absorbed in the polyimide resin layer 7.

Figure 2:
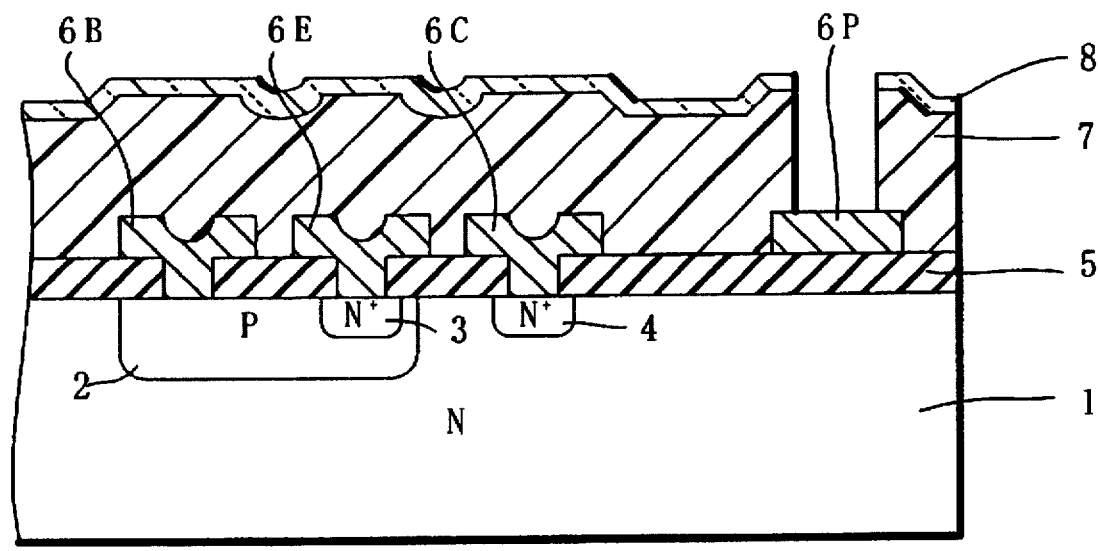
FIG. 2 is a cross-sectional view illustrating a second prior art semiconductor device.

In FIG. 2, which illustrates a second prior art semiconductor device (see JP-A-62-293726), a silicon nitride layer 8 is added to the elements of the device of FIG. 1, and accordingly, the silicon nitride layer 8 as well as the polyimide resin layer 7 serves as a passivation layer.

In FIG. 2, however, although the silicon nitride layer 8 has good moistureproofness, contact characteristics between the silicon nitride layer 8 and the polyimide layer 8 are deteriorated, so that water and ions are absorbed from the interface between the silicon nitride layer 7 and the polyimide layer 7 into the electrodes 6B, 6E, 6C, the pad 6P, and the impurity diffusion regions 2, 3 and 4. Thus, the reliability of the device is deteriorated.

Next, benzocyclobutene polymer will be explained with reference to FIGS. 3A and 3B.

Figure 3A:
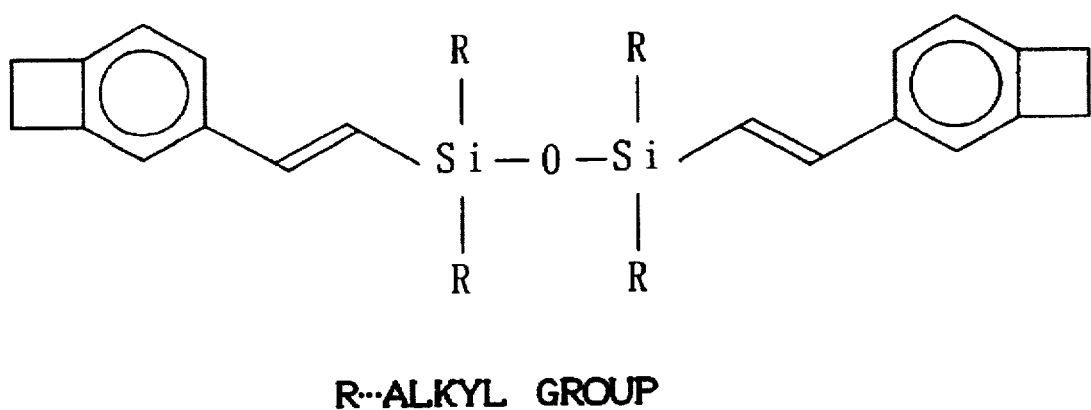
FIG. 3A is a structural formula diagram of benzocyclobutene.
Figure 3B:
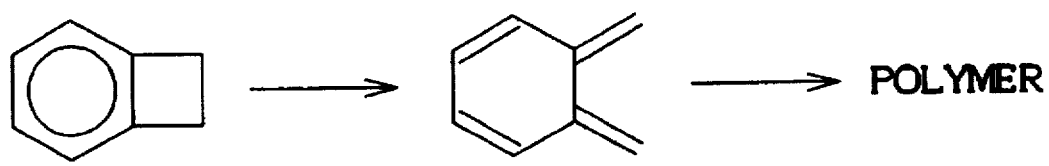
FIG. 3B is a diagram for explaining a crosslinking reaction of benzocyclobutene.

Benzocylobutene polymer is formed by using benzocyclobutene monomer having a structural formula as shown in FIG. 3A. That is, the benzocylobutene monomer is heated, so that cyclobutene portions of the benzocylobutene monomer are ring-opened by a ring-open polymerization process as shown in FIG. 3B. In such a ring-open polymerization process, benzocyclobutene is never reduced in volume, which can absorb roughness of a stepwise surface of underlying layers.

In the present invention, silicon powder, whose particle diameter is about 1 µm, for example, is loaded to the benzocylobutene polymer as a passivation layer, so as to make the thermal expansivity of the passivation layer substantially equal that of a silicon substrate.

Figure 4A:
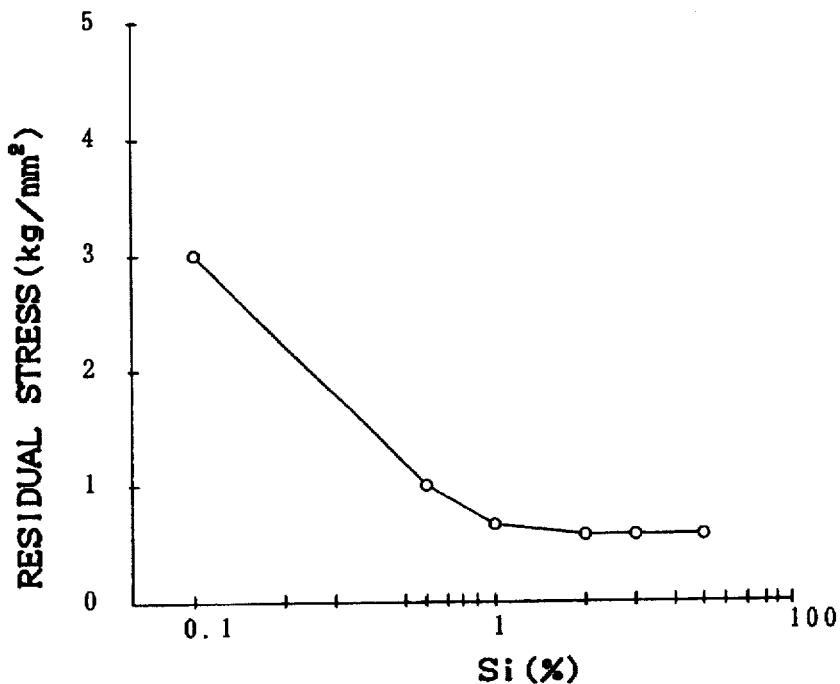
FIG. 4A is a graph showing residual stress characteristics of a mixture of benzocyclobutene polymer and silicon powder.

The weight ratio of silicon powder to benzocyclobutene polymer is preferably larger than approximately 1%. That is, as shown in FIG. 4A, which shows residual stress characteristics of a mixture of benzocylobutene and silicon powder, when the weight ratio of silicon powder is smaller than approximately 1%, the residual stress is remarkably increased, thus reducing the reliability of the passivation layer, particularly, in a large scale chip.

Figure 4B:
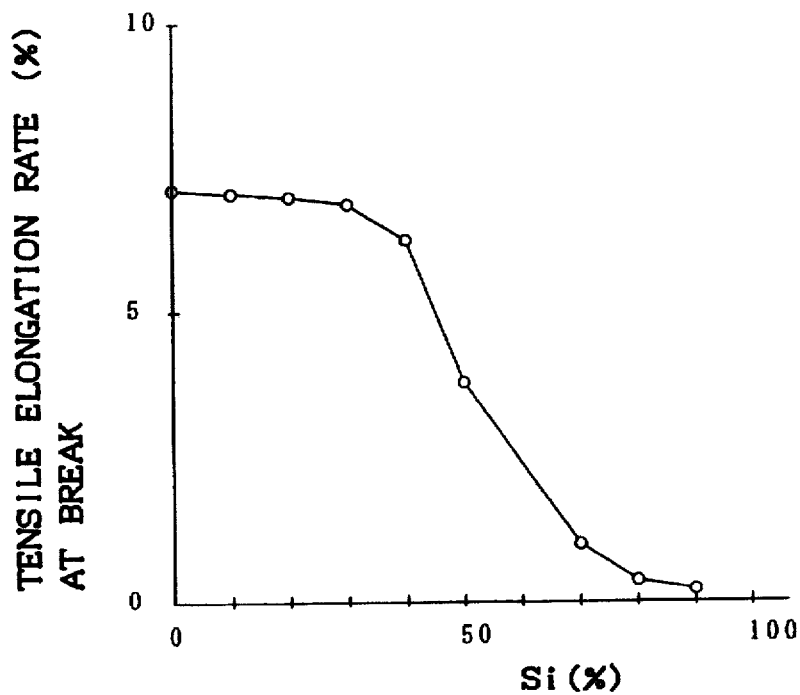
FIG. 4B is a graph showing tensile elongation rate at break of a mixture of benzocyclobutene polymer and silicon powder.

Also, the weight ratio of silicon powder to benzocyclobutene polymer is preferably smaller than approximately 90%. That is, as shown in FIG. 4B, which shows tensile elongation characteristics at break of a mixture of benzocyclobutene polymer and silicon powder, when the weight ratio of silicon powder is larger than approximately 90%, the tensile elongation rate at break is substantially 0%, so that cracks and pinholes are easily created in the passivation layer made of benzocyclobutene polymer and silicon powder.

Figure 5:
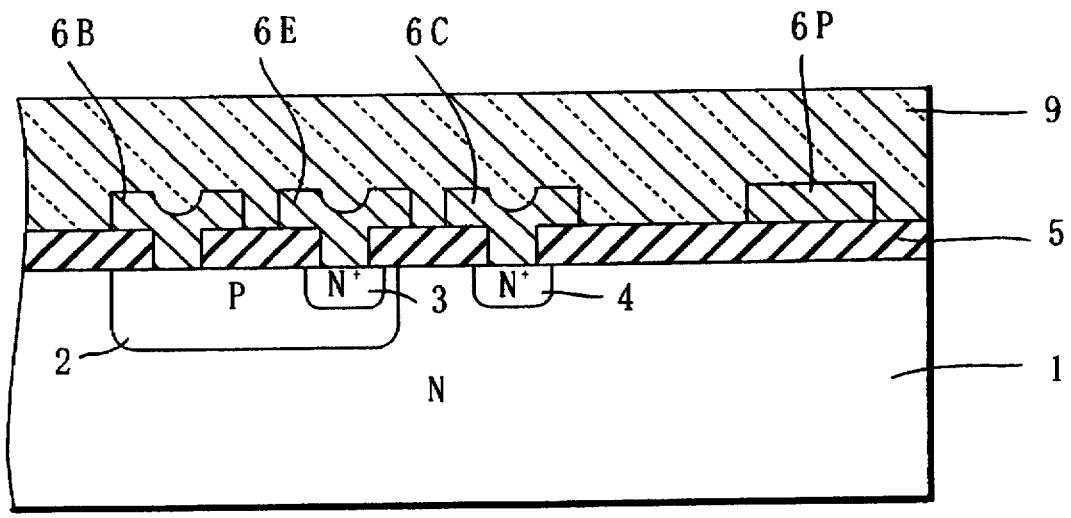
FIG. 5 is a cross-sectional view illustrating a first embodiment of the semiconductor device according to the present invention.

In FIG. 5, which illustrates a first embodiment of the present invention, a passivation layer 9 is made of benzocyclobutene polymer and silicon powder.

The formation of the passivation layer 9 is explained below.

First, benzocyclobutene oligomer is dissolved in mesitylene solvent, and also, about 1 µm particle diameter silicon powder is put into the mesitylene solvent. In this case, the weight ratio of the silicon powder to the benzocyclobutene oligomer is about 40%. Then, the solution of benzocyclobutene oligomer and mesitylene with silicon powder is stirred, and a photosensitive crosslinker is added thereto, to obtain a photosensitive coating agent.

The above-described photosensitive coating agent is coated by a spinning method as the passivation layer 9 on the entire surface as illustrated in FIG. 5, and is baked at a temperature of about 80° C. for about 20 minutes in a nitrogen atmosphere.

Next, light is irradiated onto the photosensitive coating agent with a mask (not shown), and the photosensitive coating agent is developed by using a developer on the basis of kerosine to perforate an opening for the input/output pad 6P.

Finally, a heating operation at a temperature of about 200° C. to 250° C. is carried out for about 30 minutes to harden the photosensitive coating agent to form the passivation layer 9 which is about 2 µm in thickness.

Figure 6:
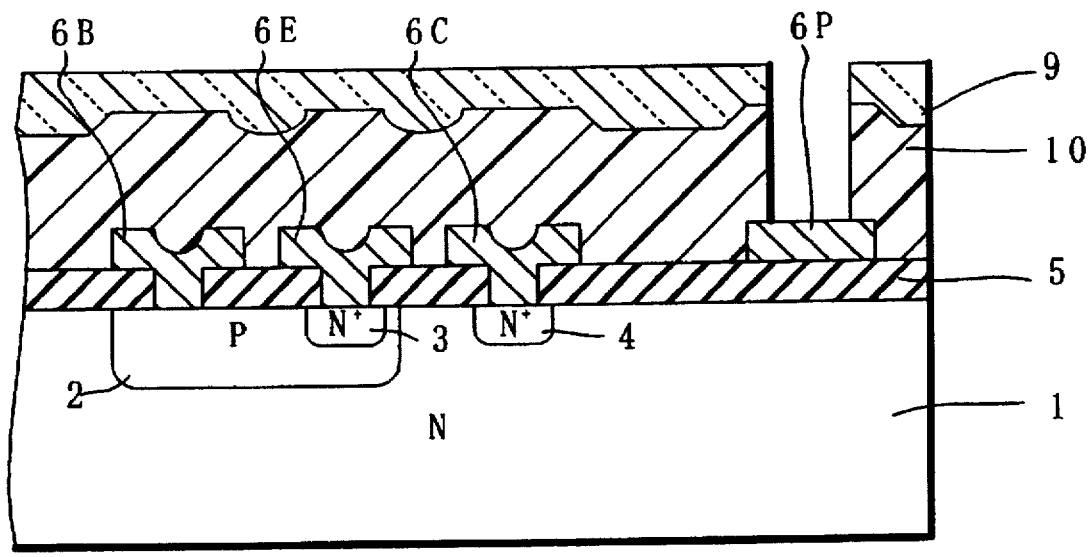
FIG. 6 is a cross-sectional view illustrating a second embodiment of the semiconductor device according to the present invention.

In FIG. 6, which illustrates a second embodiment of the present invention, another passivation layer 10 made of polyimide resin is added to the elements of FIG. 5. That is, the additional passivation layer 10 is inserted between the passivation layer 9 and the silicon oxide layer 5 of FIG. 5.

The formation of the passivation layer 9 and 10 is explained below.

First, a polyimide coating agent on the basis of polyimide precursor is coated on the entire surface as illustrated in FIG. 6. In this case, siloxane is added to the polyimide coating agent to have good contact characteristics with the silicon oxide layer 5.

Next, after a baking operation, a heat operation is carried out to create a crosslinking reaction in the polyimide precursor. Thus, the passivation layer 10 having a thickness of about 1.5 µm is obtained.

Next, the photosensitive coating agent used in the first embodiment is coated by a spinning method as the passivation layer 9 on the passivation layer 10 as illustrated in FIG. 6, and is baked at a temperature of about 80° C. for about 20 minutes in a nitrogen atmosphere.

Next, a heating operation at a temperature of about 200° C. to 200° C. is carried out for about 30 minutes to harden the photosensitive coating agent to form the passivation layer 9 which is about 0.5 µm in thickness.

Finally, an opening for the input/output pad 6P is formed in the passivation layers 9 and 10 by using a photolithography and oxygen plasma etching process.

In the second embodiment, the poor contact characteristics of the passivation layer 9 (benzocyclobutene polymer/silicon powder) to inorganic material such as silicon oxide are compensated for by the additional passivation layer 10 (polyimide) which has good contact characteristics to inorganic material.

Also, the siloxane residue included in the passivation layer 10 enhances the contact characteristics to inorganic material. Note that such a polyimide layer including siloxane residue has high water absorption properties; however, this is compensated for by the passivation layer 9 (benzocyclobutene polymer/silicon powder).

Further, in the hardening process for the passivation layer 9 (benzocyclobutene polymer/silicon powder), bezocyclobutene polymer is combined with polyimide, so that the two passivation layers 9 and 10 are in tight contact with each other.

As explained hereinbefore, according to the present invention, since the passivation layer is made of benzocyclobutene polymer which is flexible, the passivation layer can absorb stress applied thereto and can be flattened. Also, since benzocyclobutene polymer has low water absorption properties, the passivation layer can exhibit good moisture-proofness characteristics. Further, since silicon powder is included in the passivation layer, the thermal expansivity of the passivation layer can be brought close to that of a semiconductor substrate, so that the mechanical strength of a semiconductor device can be improved.

Also, the additional passivation layer made of polyimidee provides good contact characteristics with inorganic material, so that the reliability of the semiconductor device can be improved.

We claim:

1. A semiconductor device comprising:
   a semiconductor substrate,
   an inorganic insulating layer formed on said semiconductor substrate; and
   a first passivation layer made of a mixture of benzocyclobutene polymer and silicon powder, and formed on said inorganic insulating layer, wherein a weight ratio of said silicon powder to said benzocyclobutene polymer ranges approximately from 0.01 to 0.30.

2. A device as set forth in claim 1, wherein said first passivation layer further includes a photosensitive crosslinker.

3. A device as set forth in claim 1, further comprising a second passivation layer made of polyimide resin and formed between said inorganic insulating layer and said first passivation layer.

4. A device as set forth in claim 3, wherein said second passivation layer further includes siloxane residue.

5. A device as set forth in claim 3, wherein said first passivation layer is about 0.5 μm in thickness and said second passivation layer is about 1.5 μm in thickness.

6. A device as set forth in claim 1, wherein said inorganic insulating layer comprises silicon oxide.

7. A device as set forth in claim 1, wherein said passivation layer is about 2 μm in thickness.

8. A device as set forth in claim 1, wherein said weight ratio of said silicon power to said benzocyclobutene polymer ranges approximately from 0.01 to 0.20.

9. A device as set forth in claim 1, wherein said weight ratio of said silicon powder to said benzocyclobutene polymer ranges approximately from 0.01 to 0.10.

10. A device as set forth in claim 1, wherein said weight ratio of said silicon powder to said benzocyclobutene polymer ranges approximately from 0.01 to 0.30.

11. A device as set forth in claim 1, wherein said weight ratio of said silicon powder to said benzocyclobutene polymer ranges approximately from 0.1 to 0.20.

12. A device as set forth in claim 1, wherein said weight ratio of said silicon powder to said benzocyclobutene polymer ranges approximately from 0.1 to 0.10.

13. A device as set forth in claim 1, wherein said weight ratio of said silicon powder to said benzocyclobutene polymer ranges approximately from 0.1 to 0.30, and wherein said passivation layer is about 2 μm in thickness.

* * * * *